United States Patent
Park et al.

(10) Patent No.: US 8,143,142 B2
(45) Date of Patent: Mar. 27, 2012

(54) METHOD OF FABRICATING EPI-WAFER, EPI-WAFER FABRICATED BY THE METHOD, AND IMAGE SENSOR FABRICATED USING THE EPI-WAFER

(75) Inventors: Young-Soo Park, Yongin-si (KR); Gi-Jung Kim, Yongin-si (KR); Won-Je Park, Yongin-si (KR); Jae-Sik Bae, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 117 days.

(21) Appl. No.: 12/723,882

(22) Filed: Mar. 15, 2010

(65) Prior Publication Data
US 2010/0233869 A1 Sep. 16, 2010

(51) Int. Cl.
*H01L 21/322* (2006.01)

(52) U.S. Cl. ......... 438/476; 438/58; 438/471; 438/478; 438/778; 257/E21.09; 257/E21.317; 257/E21.318; 117/2

(58) Field of Classification Search .................. None
See application file for complete search history.

(56) References Cited

U.S. PATENT DOCUMENTS

| 4,416,051 | A * | 11/1983 | Thomas et al. | 438/58 |
| 6,686,259 | B2 * | 2/2004 | Park et al. | 438/471 |
| 2002/0048908 | A1 * | 4/2002 | Koveshnikov et al. | 438/476 |
| 2004/0048456 | A1 * | 3/2004 | Sato et al. | 438/542 |
| 2010/0093156 | A1 * | 4/2010 | Fujii | 438/473 |

FOREIGN PATENT DOCUMENTS

| JP | 2006-32799 | 2/2006 |
| KR | 2005-121090 | 12/2005 |
| KR | 2007-29369 | 3/2007 |
| KR | 10-714604 | 4/2007 |

* cited by examiner

*Primary Examiner* — Charles Garber
*Assistant Examiner* — Yasser Abdelaziez
(74) *Attorney, Agent, or Firm* — Stanzione & Kim, LLP

(57) ABSTRACT

A method of fabricating an epi-wafer includes providing a wafer including boron by cutting a single crystal silicon ingot, growing an insulating layer on one surface of the wafer, performing thermal treatment of the wafer, removing the insulating layer formed on one surface of the wafer, mirror-surface-grinding one surface of the wafer, and growing an epitaxial layer on one surface of the wafer and forming a high-density boron layer within the wafer that corresponds to the interface between the wafer and the epitaxial layer.

12 Claims, 14 Drawing Sheets

METHOD OF FABRICATING EPI-WAFER, EPI-WAFER FABRICATED BY THE METHOD, AND IMAGE SENSOR FABRICATED USING THE EPI-WAFER

CROSS-REFERENCE TO RELATED APPLICATIONS

This application claims priority under 35 U.S.C. §119 from Korean Patent Application No. 10-2009-0021760, filed on Mar. 13, 2009 in the Korean Intellectual Property Office, the disclosure of which is incorporated herein in its entirety by reference.

BACKGROUND

1. Field of the General Inventive Concept

The present general inventive concept relates to a method of fabricating an epi-wafer, an epi-wafer fabricated by the method, and an image sensor fabricated using the epi-wafer, and more particularly to a method of fabricating an epi-wafer, an epi-wafer fabricated by the method, and an image sensor fabricated using the epi-wafer that has an improved reliability.

2. Description of the Related Art

An image sensor is a device that converts an optical image into an electric signal. Recently, with the development of computer industry and communication industry, image sensors with an improved reliability are in great demand in diverse fields, such as digital cameras, camcorders, personal communication systems (PCSs), game machines, security cameras, medical micro cameras, robots, and the like.

On the other hand, in fabricating an image sensor, an epi-wafer has been mainly used. In an image sensor using an epi-wafer, parts of electrons that are generated in a sub substrate move to an epi-layer to cause dark current or white spot defects.

SUMMARY

Accordingly, the present general inventive concept provides a method of fabricating an epi-wafer having an improved reliability.

A subject to be solved by the present general inventive concept is to provide an epi-wafer having an improved reliability.

Another subject to be solved by the present general inventive concept is to provide an image sensor having an improved reliability.

Additional aspects and utilities of the present general inventive concept will be set forth in part in the description which follows and in part will become apparent to those having ordinary skill in the art upon examination of the following or may be learned from practice of the present general inventive concept.

The foregoing and/or other aspects and utilities of the present general inventive concept may be achieved by providing a wafer including boron by cutting a single crystal silicon ingot, growing an insulating layer on one surface of the wafer, performing thermal treatment of the wafer, removing the insulating layer formed on one surface of the wafer, mirror-surface-grinding one surface of the wafer, and growing an epitaxial layer on one surface of the wafer and forming a high-density boron layer within the wafer that to correspond to an interface between the wafer and the epitaxial layer.

When the insulating layer is formed on one surface of the wafer, boron on one surface of the wafer may be diffused into the wafer to form a high-density boron layer within the wafer.

The growing of the insulating layer on one surface of the wafer may be performed simultaneously with forming a second insulating layer on the other surface of the wafer.

A second insulating layer may be formed on the other surface of the wafer.

The insulating layer may be an oxide layer, an oxynitride layer, or a nitride layer.

The foregoing and/or other aspects and utilities of the present general inventive concept may also be achieved by providing a wafer including high-density boron by cutting a single crystal silicon ingot, growing an oxide layer on one surface of the wafer by a low-temperature oxidation process, diffusing boron on the other surface of the wafer into the inside of the wafer by growing an oxide layer on the other surface of the wafer by a middle-temperature oxidation process, removing the oxide layer formed on the other surface of the wafer, mirror-surface-grinding the other surface of the wafer, and growing an epitaxial layer on the other surface of the wafer and forming a high-density boron layer within the wafer that corresponds to an interface between the wafer and the epitaxial layer.

Thermal treatment of the wafer may also be performed after the oxide layer is formed on the other surface of the wafer.

The foregoing and/or other aspects and utilities of the present general inventive concept may also be achieved by providing a wafer including boron by cutting a single crystal silicon ingot, growing an oxide layer on one surface of the wafer, removing the oxide layer formed on one surface of the wafer, removing the oxide layer formed on one surface of the wafer, mirror-surface-grinding one surface of the wafer, and growing an epitaxial layer on one surface of the wafer and forming a high-density boron layer within the wafer that corresponds to an interface between the wafer and the epitaxial layer.

The foregoing and/or other aspects and utilities of the present general inventive concept may be achieved by providing an epi-wafer, which includes a wafer including boron, a high-density boron layer formed within the wafer and having a boron density higher than a boron density of other regions, and an epitaxial layer formed on the wafer, wherein the high-density boron layer is formed within the wafer that to correspond to an interface between the epitaxial layer and the wafer.

In still another aspect of the present general inventive concept, there is provided an image sensor fabricated using the epi-wafer.

The foregoing and/or other aspects and utilities of the present general inventive concept may also be achieved by forming a doped semiconductor ingot, cutting the semiconductor ingot into at least one doped sub substrate, thermally oxidizing the doped substrate to form a highly doped layer in an upper surface of the sub substrate and a semiconductor oxide layer above the highly doped layer, removing the semiconductor oxide layer from the sub substrate, and growing an epitaxial layer above the sub substrate and forming a plurality of doped regions within the epitaxial layer.

A substrate may be formed above the sub substrate, and a deep well region of a first conductivity type may be formed above the substrate and below the epitaxial layer.

Thermal oxidizing may form a doped silicon region within the semiconductor oxide layer.

The foregoing and/or other aspects and utilities of the present general inventive concept may also be achieved by forming an ingot with a substantially uniform density of dopants of a first conductivity type, dividing the ingot into at least one substrate, growing a silicon oxide layer on the substrate, and diffusing the dopants into the silicon oxide layer from the substrate, wherein the density of the dopants in the substrate is increased at a junction between the substrate and silicon oxide layer and decreased in lower portions of the substrate.

The foregoing and/or other aspects and utilities of the present general inventive concept may also be achieved by providing a silicon sub substrate including multiple layers of varying densities of dopants, the sub substrate including a plurality of layers having different boron density levels with the sub substrate, and a high-density boron layer having a higher boron density than a mean boron density of the plurality of layers of the sub substrate, a substrate formed above the sub substrate, a deep well region formed above the substrate, and an epitaxial layer formed above the deep well to include a plurality of doped regions within the epitaxial layer.

The foregoing and/or other aspects and utilities of the present general inventive concept may also be achieved by providing a semiconductor device including a first silicon oxide layer, a sub substrate formed above the first silicon oxide layer, the sub substrate having a deep portion and an upper portion, the upper portion having a high-density boron layer, a well of a first conductivity type formed above the sub substrate, an epitaxial layer of the first conductivity type formed above the well, and a photoelectric conversion unit formed within the epitaxial layer, wherein the high-density boron layer forms a potential barrier to prevent electrons generated in the deep portion of the sub substrate from flowing into the photoelectric conversion unit.

The semiconductor device may also include at least one isolation region delineating at least one active area within the epitaxial layer, a photodiode and the photoelectric conversion unit formed in the active area, and at least one separation well formed contiguous to the photodiode, adjacent a side of the isolation region and below the isolation region.

The foregoing and/or other aspects and utilities of the present general inventive concept may also be achieved by providing semiconductor apparatus including a sensor array in which pixels including light sensing elements are arranged in two dimensions, the sensor array including a plurality of unit pixels two-dimensionally arranged that serve to convert an optical image into an electric output signal, the unit pixels including a photoelectric conversion unit, charge transmission unit and charge detection unit disposed within an active layer of an epitaxial layer of a semiconductor device, and a highly doped layer of a first conductivity type disposed in an upper layer of a sub substrate beneath the epitaxial layer to prevent cross-talk within the sensor array.

The foregoing and/or other aspects and utilities of the present general inventive concept may also be achieved by providing an electronic device including an image sensor packaged with bonding wires on a circuit board, the image sensor further including a semiconductor device having a photoelectric conversion unit, charge transmission unit and charge detection unit disposed within an active layer of an epitaxial layer of the semiconductor device, and a highly doped layer of a first conductivity type disposed in an upper layer of a sub substrate beneath the epitaxial layer to prevent cross-talk within the image sensor, a housing including an optical tube and a protection cover, at least one lens, an aperture, and at least one transparent substrate to form an outer shell of a camera or mobile phone.

BRIEF DESCRIPTION OF THE DRAWINGS

These and other objects, features and utilities of the present general inventive concept will be more apparent from the following detailed description taken in conjunction with the accompanying drawings, in which.

DETAILED DESCRIPTION OF THE EMBODIMENTS

Figure 1:
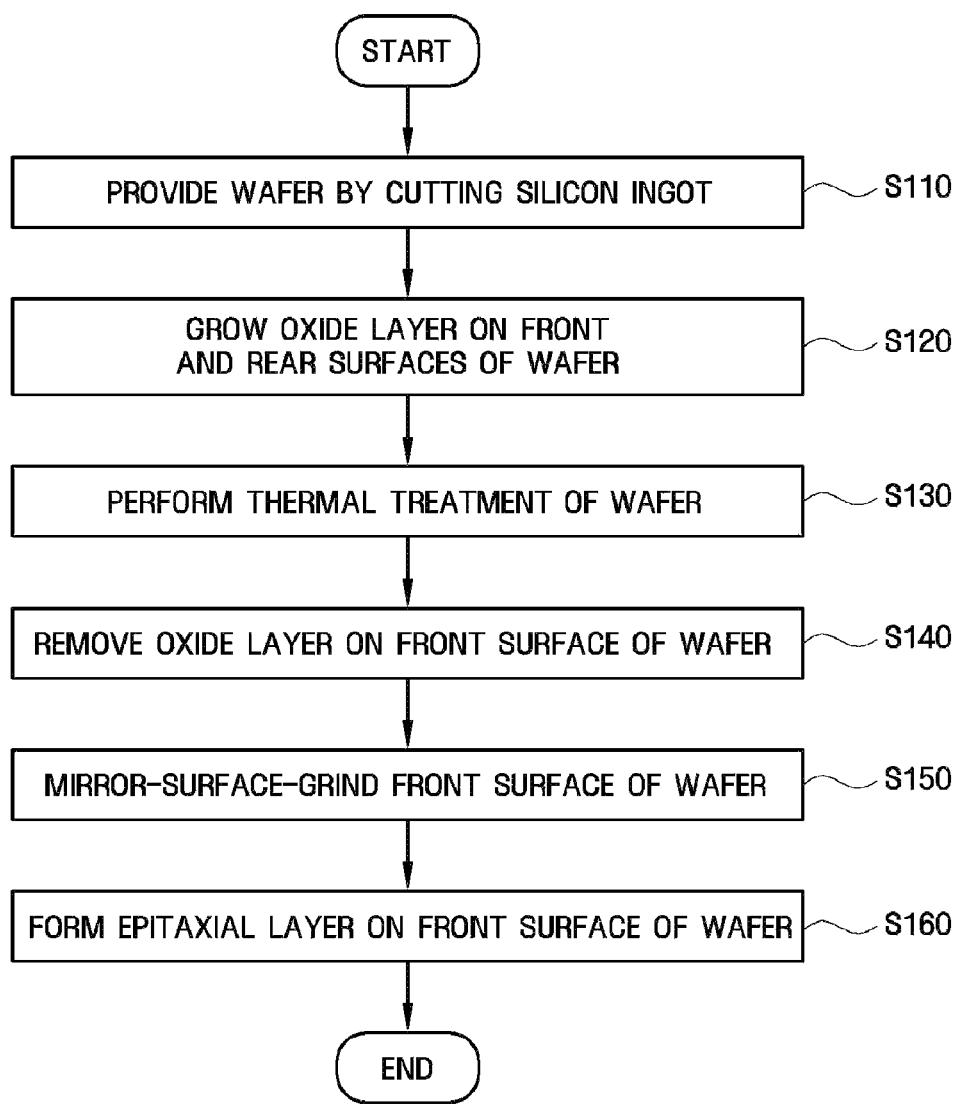
FIG. 1 is a flowchart illustrating a method of fabricating a wafer according to an embodiment of the present general inventive concept.

Hereinafter, example embodiments of the present general inventive concept will be described in detail with reference to the accompanying drawings. The aspects and utilities of the present general inventive concept and methods to achieve the aspects and utilities will be apparent by referring to the embodiments to be described in detail with reference to the accompanying drawings. However, the present general inventive concept is not limited to the embodiments disclosed hereinafter, but can be implemented in diverse forms. The matters defined in the description, such as the detailed construction and elements, are examples of specific details provided to assist those of ordinary skill in the art in a comprehensive understanding of the general inventive concept, and the present general inventive concept is only defined within the scope of the appended claims. In some embodiments of the present general inventive concept, well-known element structures and technologies are not described in detail since they would obscure the general inventive concept in unnecessary detail.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The term "connected to" or "coupled to" that is used to designate a connection or coupling of one element to another element includes both a case that an element is "directly connected or coupled to" another element and a case that an element is connected or coupled to another element via still another element. In this case, the term "directly connected to" or "directly coupled to" means that an element is connected or coupled to another element without intervention of any other element. In the entire description of the present general inventive concept, the same drawing reference numerals are used for the same elements across various figures. Also, the term "and/or" includes the respective described items and combinations thereof.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be different from or may be identical to a second element, second component, or second section.

In the following description of the present general inventive concept, the terms used are to explain embodiments of the present general inventive concept, but do not limit the scope of the present general inventive concept. In the description, a singular expression may include a plural expression unless specially described. The term "comprises," "includes," "comprising" and/or "including" used in the description means that one or more other components, steps, operation and/or existence or addition of elements are not excluded in addition to the described components, steps, operation and/or elements.

Unless specially defined, all terms (including technical and scientific terms) used in the description could be used as meanings commonly understood by those ordinary skilled in the art to which the present general inventive concept belongs. In addition, terms that are generally used but are not defined in the dictionary are not interpreted ideally or excessively unless they have been clearly and specially defined.

Hereinafter, with reference to the accompanying drawings, an image sensor according to embodiments of the present general inventive concept will be described in detail.

An image sensor according to embodiments of the present general inventive concept includes a charge coupled device (CCD) and a CMOS image sensor. Here, the CCD has a low noise and a superior picture quality in comparison to the CMOS image sensor, but requires a high voltage and a high manufacturing cost. The CMOS image sensor has a simple driving method and can be implemented by diverse scanning methods. Also, a signal processing circuit can be integrated into a single chip, and the miniaturization of the product becomes possible. Also, the CMOS process technology can be compatibly used and thus the manufacturing cost can be reduced. Also, the power consumption is very low, and thus the device can be easily applied to a product having a limited battery capacity. Accordingly, hereinafter, a CMOS image sensor will be described as the image sensor according to an embodiment of the present general inventive concept. However, it will be apparent that the technical thoughts of the present general inventive concept can be applied to the CCD as it is.

According to the method of fabricating a wafer and the wafer fabricated by the method according to embodiments of the present general inventive concept, a wafer including high-density boron is fabricated. However, the present general inventive concept is not limited thereto. That is, it will be apparent that the wafer may include low-density boron, or other dopants may be additionally added. Also, only other dopants except for boron may be added. In this case, the description of the density of boron may be understood as an exemplary description, and the technology of boron in the following description may be extendedly applied to other dopants.

Hereinafter, with reference to FIGS. 1 to 6, a method of fabricating a wafer according to an embodiment of the present general inventive concept will be described. FIG. 1 is a flow-chart illustrating a method of fabricating a wafer according to an embodiment of the present general inventive concept. FIGS. 2 to 6 are sectional views illustrating a method of fabricating a wafer according to an embodiment of the present general inventive concept.

Figure 2:
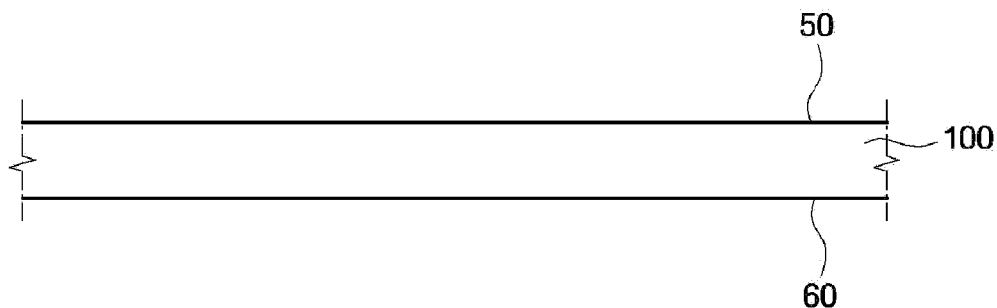
FIGS. 2 to 6 are sectional views illustrating a method of fabricating a wafer according to an embodiment of the present general inventive concept.

First, referring to FIGS. 1 and 2, a plurality of wafers are provided by cutting single crystal silicon ingot as described in operation S110.

Specifically, after polysilicon is fused, a single crystal silicon ingot having the same crystal direction may be formed using the Czochralski method or floating zone method. In order to provide a desired electric characteristic, first and second type conduction type dopants such as n-type and p-type dopants may be added to the silicon ingot or later formed semiconductor wafer. For example, p-type dopants such as boron or n-type dopants such as phosphorus, arsenic, antimony, or the like, may be added. The dopants may be added in such a away as to produce an ingot with a substantially uniform or varied dopant concentration throughout the ingot. In the method of fabricating a wafer according to an embodiment of the present general inventive concept, boron is added at high density to the single crystal silicon ingot. Other elements may also be added. Here, high-density boron means that in the case where the number of silicon particles constituting the wafer is about $5 \times 10^{21}$ atom/cm$^3$ per unit area, the number of boron particles becomes more than $1 \times 10^{16}$ atom/cm$^3$ per unit area, for example, is $1 \times 10^{18}$–$1 \times 10^{19}$ atom/cm$^3$. Such a high-density boron wafer, for example, may be used in an image sensor.

By cutting the single crystal ingot, a plurality of wafers 100 may be provided. The wafers 100 may also be described as sub substrates in exemplary embodiments of the present general inventive concept. In this case, the single crystal silicon ingot may be cut by diamond, wire or laser.

A multi-stage process of leveling the cut wafer 100 may be performed. Specifically, an edge grinding process to round the edge and a lapping process to remove saw-toothed portions and defects of the front and rear surfaces of the wafer 100 and remove stress having occurred in the cutting process may be performed.

Figure 3:
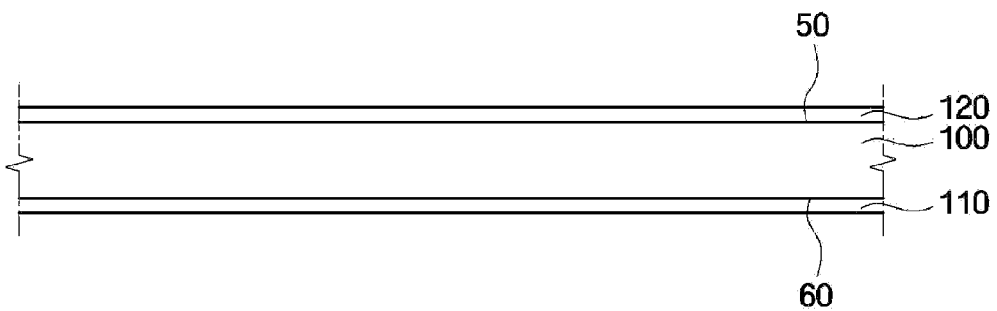

Referring to FIGS. 1, 2 and 3, on the front 50 and rear 60 surfaces of the wafer 100, oxide layers 110 and 120 may be grown as described in operation S120.

In this case, the front surface oxide layer 120 and the rear surface oxide layer 110 may be formed as MTO (Middle Temperature Oxide) layers, for example, at temperatures of about 800-1000° C. with a thickness of about 10-2000 Å. Also, the front surface oxide layer 120 and the rear surface oxide layer 110 may be formed as LTO (Low Temperature Oxide) layers. In this case, the thickness of the front surface oxide layer 120 and the rear surface oxide layer 110 may be, for example, 3000-10000 Å.

When growing the oxide layer 120 on the front surface 50 of the wafer 100, an oxidation process such as thermal oxidation may be performed under an oxygen environment. In this case, the Si on the surface of the wafer 100 can be combined with the provided oxygen of the oxidation process to form SiO$_2$. At this time, as a result of the oxidation process, boron existing in the wafer 100 may be diffused to an outside portion of the wafer 100. That is, when the Si on the upper part of the wafer 100 is combined with oxygen, boron existing in the neighborhood of the front surface may move towards a lower part of the SiO$_2$ layer, and accumulate in an upper portion of the wafer 100. Accordingly, if the oxide layer 120 is formed on the front surface of the wafer 100, a high-density boron layer 105, in which the density of boron is higher than that in other regions, may be formed in an upper region of the wafer 100. The high-density boron layer 105 may be a region having a higher boron density than a mean boron density inside the other portions of the wafer 100. Other portions of the wafer 100 may include a plurality of other layers of boron density concentration, of varying levels, different and lower than the high-density boron layer 105.

The rear surface oxide layer 110 formed on the rear surface of the wafer 100 prevents boron included in the wafer from volatilizing to the outside.

Figure 4:
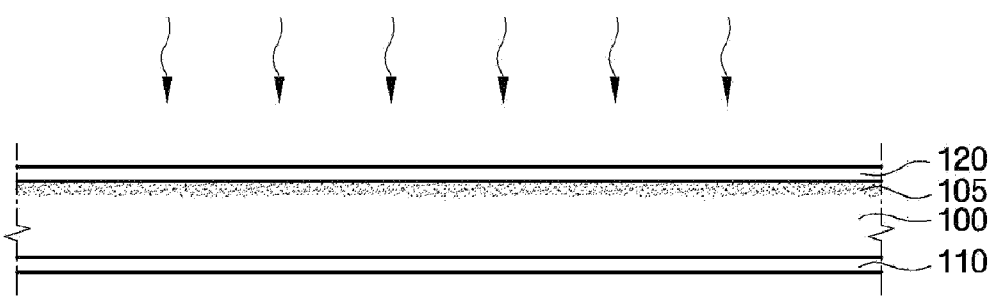

Referring to FIGS. 1 and 4, the wafer 100 may be thermally treated as described in operation S130.

Thermal treatment may be performed at 500-1000° C. from 10 seconds to 720 minutes. By performing thermal treatment, the density of the high-density boron layer 105 on the front surface of the wafer 100 may become uniform. Also, through the thermal treatment, impurities in the wafer 100 are removed, and thus the density of the high-density boron layer 105 within the wafer 100 may become higher.

Figure 5:
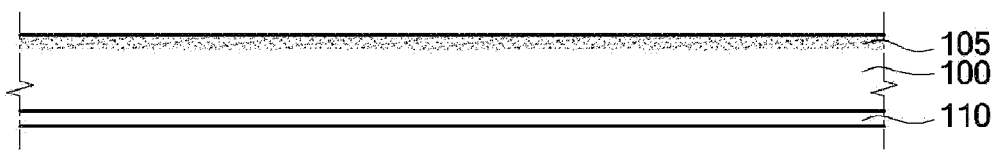

Referring to FIGS. 1 and 5, the oxide layer 120 on the front surface of the wafer 100 may be removed as described in operation S140.

Removing of the front surface oxide layer 120 may be performed by an etching process, for example, using an etchant including HF and/or SC1 process. Also, a surface etching process of lowering the surface defect and the roughness of a corner portion, which is one of general wafer fabricating process, may be performed to remove the front surface oxide layer. The surface etching process may be performed using a mixed etchant in which hydrochloric acid, nitric acid, and acetic acid are mixed. By removing the front surface oxide layer 120, the high-density boron layer having a higher boron density than that of other regions in the wafer 100 can be exposed.

Referring to FIG. 1, the front surface of the wafer 100 may be mirror-surface-grinded as described in operation S150.

The above-described process may be performed to increase the evenness and surface precision of the processed wafer 100 and to make a mirror surface. Generally, the mirror-surface-grinding may be performed by chemical mechanical polishing. That is, the wafer is put on a grinding pad into which slurry has been injected, and a precise surface grinding may be performed to apply a constant weight to the wafer. The grinding process may be repeated two or more times.

Figure 6:
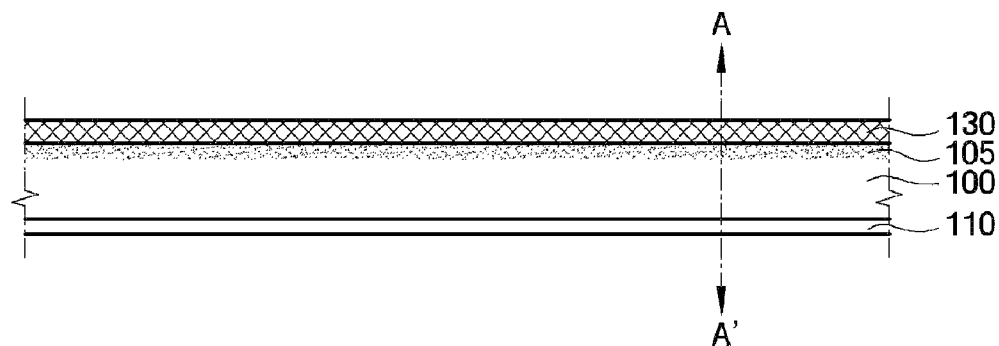

Referring to FIGS. 1 and 6, an epitaxial layer 130 can be formed on the front surface of the wafer 100 as described in operation S160.

The epitaxial layer 130 may be formed by performing a selective epitaxial growth (SEG) process.

The selective epitaxial growth process may be performed by, but is not limited to, chemical vapor deposition (CVD), reduced pressure chemical vapor deposition (RPCVD), ultra high vacuum chemical vapor deposition (UHVCVD), or the like. The selective epitaxial growth may be performed by supplying a source gas, and as a source gas, $SiH_4$, dichloro silane (DCS) $SiH_2Cl_2$, trichloro silane (TCS) $SiHCl_3$, or the like may be used. Also, during the selective epitaxial growth, impurities may be doped by in-situ, and after the selective epitaxial growth, impurities may be separately doped.

The selective epitaxial process may be performed at about 1000 to 1200° C., or as a low temperature process performed at about 800 to 980° C. In the case of the low temperature selective epitaxial growing process that may be performed at low temperature, the change of the density of boron constituting the high-density boron layer 105 can be minimized by the selective epitaxial growing process.

FIG. 6 is a sectional view illustrating a wafer according to an embodiment of the present general inventive concept.

Referring to FIG. 6, according to an embodiment of the present general inventive concept, the high-density boron layer 105 having a high boron density is formed adjacent the surface of the wafer 100, and may serve as a barrier layer that prevents electrons within the wafer 100 from moving to the epitaxial layer 130. The high-density boron layer 105 is not formed by a separate ion injection process or the like, but is formed during a wafer fabricating process. That is, since it is not required to perform a separate ion injection process or the like, the fabricating cost can be reduced, and wafer damage which may be caused by an additional performing of the ion injection process can be prevented. Also, since the high-density boron layer 105 of the wafer 100 according to an embodiment of the present general inventive concept may be formed during the wafer fabricating process, a more stable high-density boron layer 105 can be provided.

Figure 7:
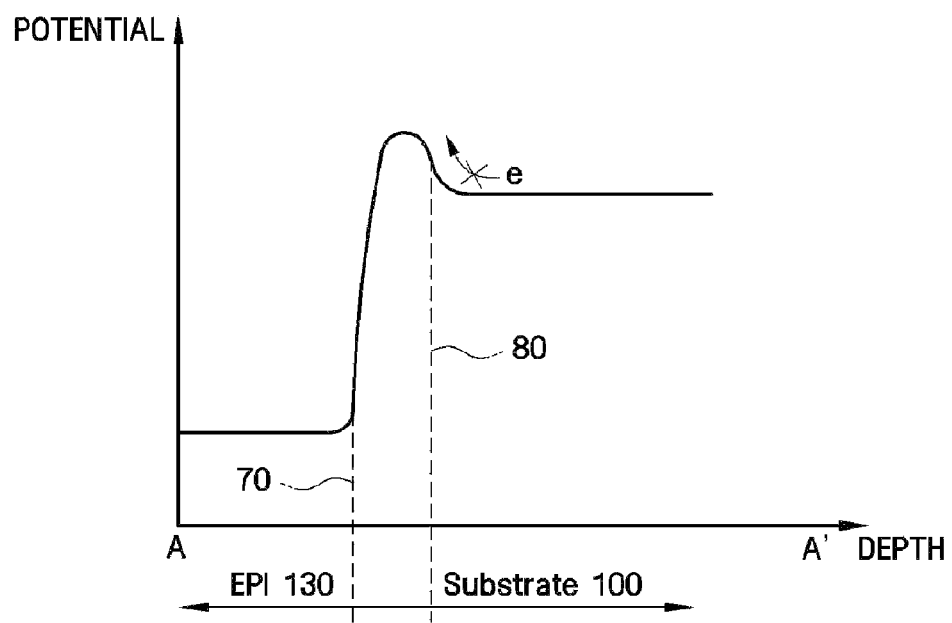
FIG. 7 is a flowchart illustrating a method of fabricating a wafer according to another embodiment of the present general inventive concept.

FIG. 7 is a potential diagram taken along line A-A' in FIG. 6. Referring to FIG. 7, potential in an upper region of the wafer 100 that is a boundary between the epitaxial layer 130 and the wafer 100 is heightened. That is, the high-density boron layer 105 forms a potential barrier, and prevents electrons inside the wafer 100 from flowing into the epitaxial layer 130.

Dotted line 70 represents an approximate depth boundary between the epitaxial layer 130 and the substrate wafer 100. Dotted line 80 represents a potential barrier to correspond to an approximate depth boundary between the bottom of the high-density boron layer 105 and the rest of the wafer 100. As illustrated, once electrons approach the potential barrier 80 of the high-density boron layer 105, the electrons are prevented from flowing into the epitaxial layer 130.

Figure 8:
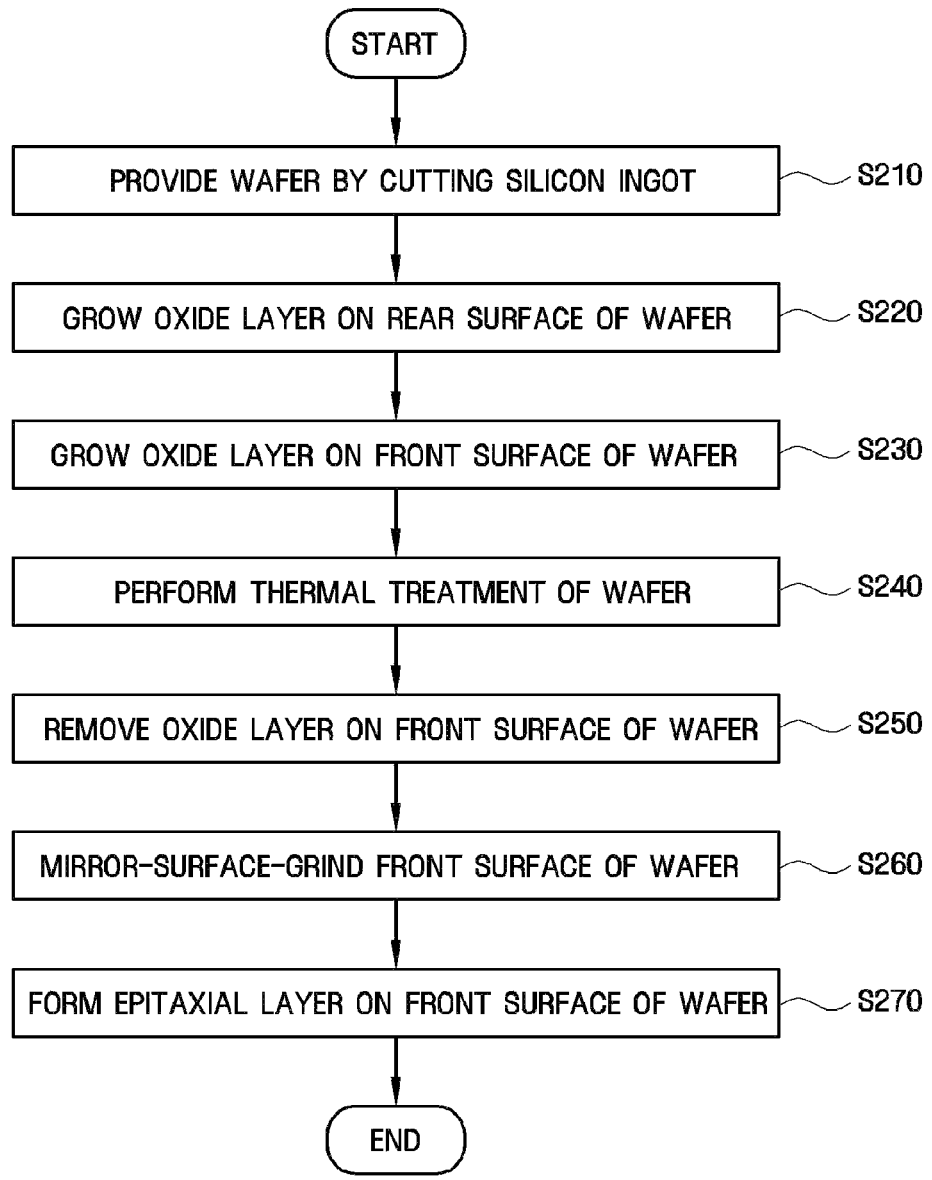
FIGS. 8 to 14 are sectional views illustrating a method of fabricating a wafer according to another embodiment of the present general inventive concept.

Hereinafter, with reference to FIGS. 8 to 15, the method of fabricating a wafer according to another embodiment of the present general inventive concept will be described. FIG. 8 is a flowchart illustrating a method of fabricating a wafer according to another embodiment of the present general inventive concept. FIGS. 9 to 15 are sectional views illustrating the method of fabricating a wafer according to another embodiment of the present general inventive concept.

Figure 9:
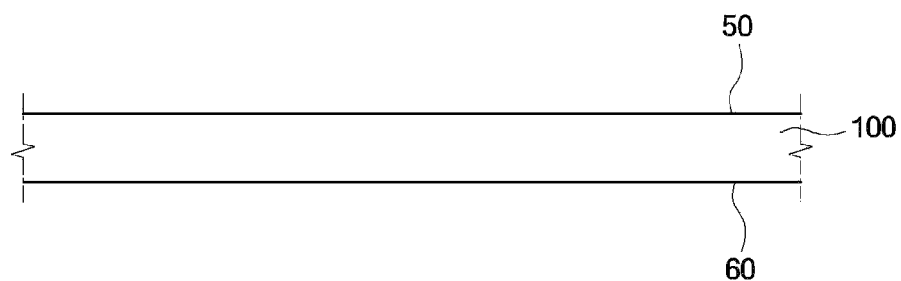

First, referring to FIGS. 8 and 9, a wafer 100 is provided by cutting a single crystal silicon ingot as described in operation S210.

Specifically, the single crystal silicon ingot may be grown by adding high-density boron, and can be cut to provide a plurality of wafers or sub substrates 100. In this case, the ingot may be cut by diamond, wire or laser.

A multi-stage process of leveling the cut wafer 100 may be performed. Specifically, an edge grinding process to round the edges of the wafer and a lapping process to remove saw-toothed portions and defects of the front 50 and rear 60 surfaces of the wafer 100 and to remove stress having occurred in the cutting process are performed.

Figure 10:
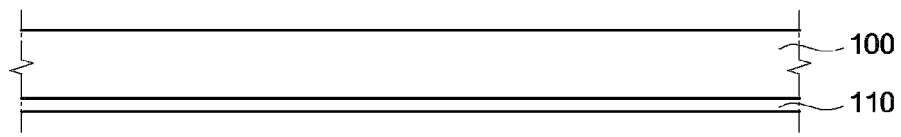

Referring to FIGS. 8 and 10, an oxide layer 110 may be grown on the rear surface 60 of the wafer 100 as described in operation S220. The rear surface oxide layer 110 may be formed as an LTO (Low Temperature Oxide) layer, for example, with a thickness of about 3000-10000 Å.

Figure 11:
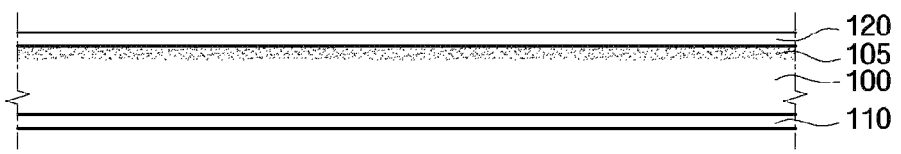

Referring to FIGS. 8 and 11, an oxide layer 120 may be grown on the front surface 50 of the wafer 100 as described in operation S230.

Figure 12:
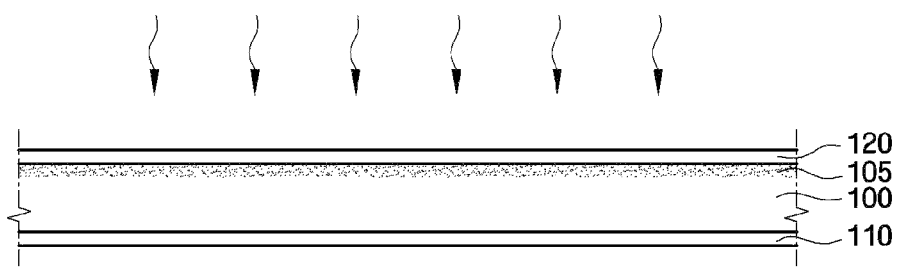

The front surface oxide layer 120 may be formed as an MTO (Middle Temperature Oxide) layer ° C. with a thickness of about 10-1000 Å. When growing the oxide layer 120 on the front surface of the wafer 100, an oxidation process may be performed under an oxygen environment. In this case, Si on the surface of the wafer 100 is combined with the provided oxygen to form a layer of $SiO_2$ on the front surface 50 of the semiconductor wafer 100. At this time, boron existing in the wafer 100 may be diffused into the inside of the $SiO_2$. If the oxide layer 120 is formed on the front surface of the wafer 100, a high-density boron layer 105, in which the density of boron is greatly higher than that in other regions, is formed in a region of a lower part of the front surface oxide layer 120, i.e. in an upper region of the wafer 100. Referring to FIGS. 8 and 12, the wafer 100 is thermally treated as described in operation S240.

For example, thermal treatment may be performed at 500-1000° C. for 10 seconds to 720 minutes.

Figure 13:
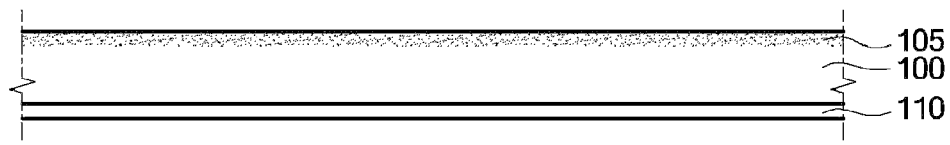

Referring to FIGS. 8 and 13, the oxide layer 120 on the front surface 50 of the wafer 100 may be removed as described in operation S250.

The removing of the front surface oxide layer 120 may be performed by an etching process, for example, using an etchant including HF and/or SC1 process. Also, a surface etching process of lowering the surface defect and the roughness of a corner portion, which is one of a general wafer fabricating process, may be performed to remove the front surface oxide layer. The surface etching process may be performed using a mixed etchant in which hydrochloric acid, nitric acid, and acetic acid are mixed. By removing the front surface oxide layer 120, the high-density boron layer 105 having a higher born density than that of other regions in the wafer 100 may be exposed.

Referring to FIG. 8, the front surface of the wafer 100 may be mirror-surface-grinded as described in operation S260.

The above-described process may be performed to increase the evenness and surface precision of the processed wafer 100 and to make a mirror surface. Generally, the mirror-surface-grinding may be performed by chemical mechanical polishing. That is, the wafer may be put on a grinding pad into which slurry has been injected, and a precise surface grinding can be performed by applying a constant weight to the wafer. The grinding process may be repeated two or more times to achieve a desired smoothness, mirror surface and/or evenness of the wafer 100.

Figure 14:
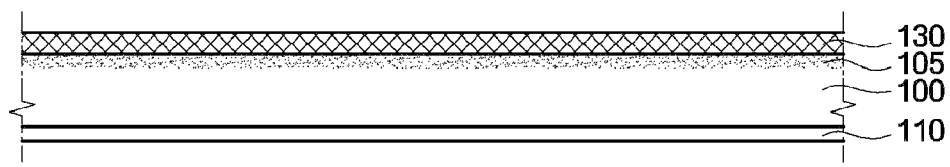

Referring to FIGS. 8 and 14, an epitaxial layer 130 may be formed on the front surface of the wafer 100 as described in operation S270. The epitaxial layer 130 may be formed by performing a temperature selective epitaxial growth (SEG) process. A SEG process may be, for example, a low temperature selective epitaxial growth (SEG) process.

In the method of fabricating a wafer according to another embodiment of the present general inventive concept, the front surface oxide layer 120 may be formed after the rear surface oxide layer 110 is formed. Also as described above, the front surface oxide layer 120 may be formed before the rear surface oxide layer 110.

The method of fabricating a wafer according to the embodiment of the present general inventive concept in which either one of the front surface oxide layer 120 or rear surface oxide layer 110 is formed first is different from the wafer provided by the method of fabricating a wafer according to a previously described embodiment of the present general inventive concept.

When desiring to form only one surface oxide layer, either on the front surface 50 or the rear surface 60 of the semiconductor wafer, additional operations may be performed. A barrier layer or mask may be formed atop either the front surface 50 or rear surface 60 to shield the surface of either layer from being oxidized during an oxidation process and forming a layer of silicon oxide thereon. Such a process may be desired or may be beneficial when active regions may be desired to be formed on only one surface of the substrate, for example. Also, forming only one silicon oxide layer on either the front surface 50 or the rear surface 60 of the wafer 100 eliminates the added operation of etching away or otherwise removing an undesired silicon oxide layer and added operations of polishing and grinding of the wafer 100.

Figure 15:
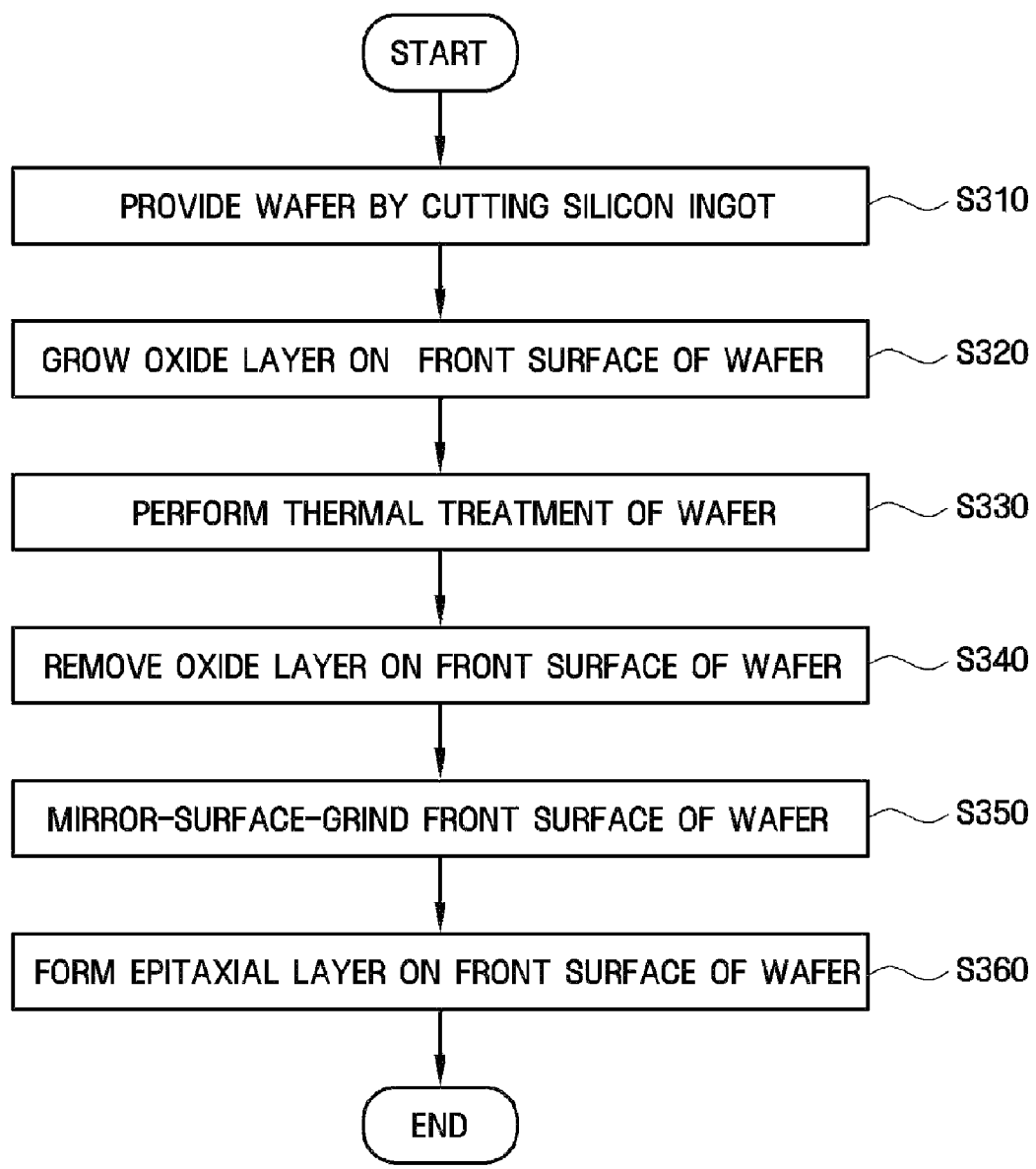
FIG. 15 is a flowchart illustrating a method of fabricating a wafer according to still another embodiment of the present general inventive concept.

Hereinafter with reference to FIGS. 15 to 20, a method of fabricating a wafer according to still another embodiment of the present general inventive concept will be described. FIG. 15 is a flowchart illustrating a method of fabricating a wafer according to still another embodiment of the present general inventive concept. FIGS. 16 to 20 are sectional views illustrating a method of fabricating a wafer according to still another embodiment of the present general inventive concept.

Hereinafter, the description of the contents which are identical to those in the method of fabricating a wafer according to an embodiment of the present general inventive concept and the contents which are well known to those of ordinary skill in the art to which the general inventive concept pertains will be omitted.

Figure 16:
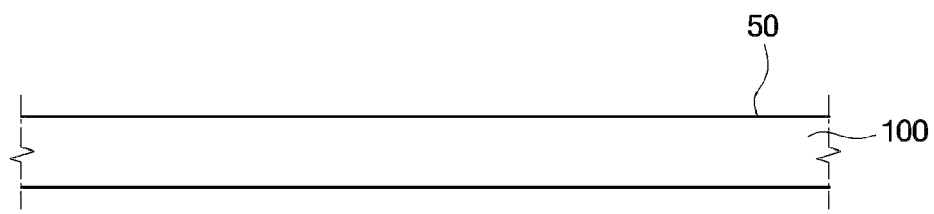
FIGS. 16 to 20 are sectional views illustrating a method of fabricating a wafer according to still another embodiment of the present general inventive concept.
Figure 17:
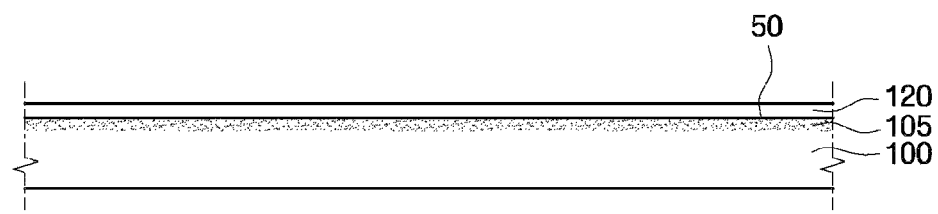
Figure 18:
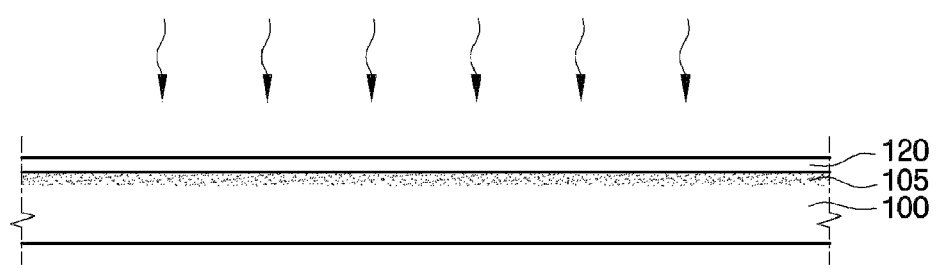
Figure 19:
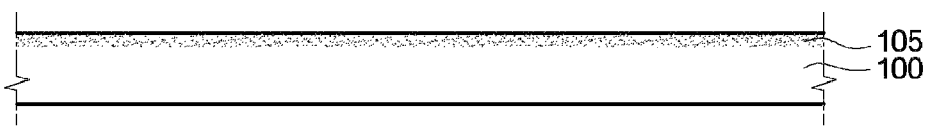
Figure 20:
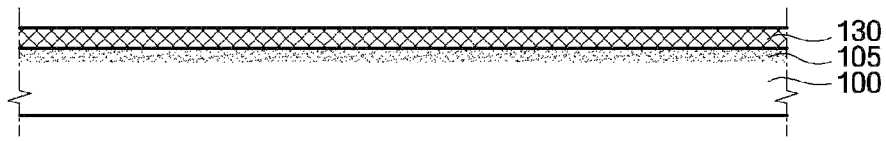

Referring to FIGS. 15 and 16, a plurality of wafers are provided by cutting single crystal silicon ingot as described in operation S310, and a multi-stage process of leveling the cut wafer 100 is performed. Referring to FIGS. 15 and 17, an oxide layer 120 is grown on the front surface 50 of the wafer 100 as described in operation S320, and a high-density boron layer 105, in which the density of boron is greatly higher than that in other regions, is formed in an upper region of the wafer 100. Referring to FIGS. 15 and 18, the wafer 100 can be thermally treated as described in operation S330, and referring to FIGS. 15 and 19, the oxide layer 120 on the front surface of the wafer 100 may be removed as described in operation S340. Referring to FIG. 15, the front surface of the wafer 100 is mirror-surface-grinded as described in operation S350, and referring to FIGS. 15 and 20, an epitaxial layer 130 is formed on the front surface of the wafer 100 S360.

According to the method of fabricating a wafer according to still another embodiment of the present general inventive concept, no oxide layer may be formed on the rear surface of the wafer 100. That is, only the epitaxial layer 130 is formed on the front surface of the epi-wafer finally formed.

Whether to form an oxide layer on the rear surface of the wafer 100 may differ according to the wafer type and the element type to be formed and also depending upon the wafer forming process.

Also, in example embodiments of the present general inventive concept, it is exemplified that an oxide layer such as the oxide layer 120 may be formed on the front surface of the wafer 100. However, the present general inventive concept is not limited thereto, and the layer formed on the front surface of the wafer 100 may be an insulating layer such as a nitride layer, an oxynitride layer, or the like.

Also, in example embodiments of the present general inventive concept, before forming the oxide layer 120, SiGeC may be formed, and an oxidization process is performed.

Figure 21:
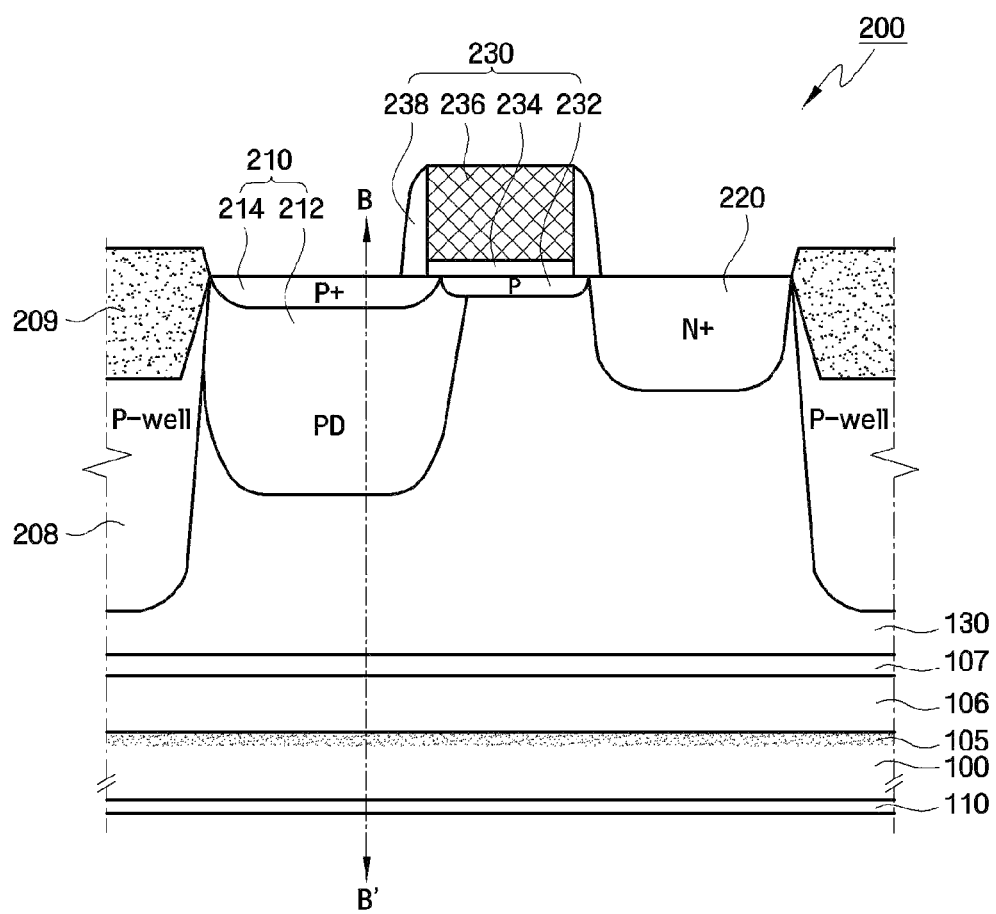
FIG. 21 are a sectional views illustrating a unit pixel of an image sensor according to example embodiments of the present general inventive concept.

FIG. 21 is a sectional view of a unit pixel of an image sensor according to an embodiment of the present general inventive concept.

Referring to FIG. 21, an image sensor 200 according to an embodiment of the present general inventive concept includes a sub substrate 100 and substrate 106 composed of a wafer on which an N or P type epitaxial layer 130 is formed, an isolation or separation well 208 formed within the epitaxial layer 130, an isolation region 209, a photoelectric conversion unit 210, a charge detection unit 220, and a charge transmission unit 230. The substrate 106 may be of a first conduction (N) type or a second conduction (P). In an embodiment of the present general inventive concept, pinned photodiodes (PPD) may be used as the photoelectric conversion unit 210.

The sub substrate 100 may be provided with the high-density boron layer 105 formed on the surface of the sub substrate 100. The high-density boron layer 105 is a region having a higher boron density than a mean boron density inside the sub substrate 100. The high-density boron layer 105 forms a potential barrier so as to prevent electrons generated in a deep place of the wafer 100 from flowing into the photoelectric conversion unit 210, and serves to increase the recombination phenomenon of electrons and holes. Accordingly, crosstalk between pixels due to random drift of the electrons can be reduced.

On the high-density boron layer 105, the epitaxial layer 130 is formed, and on the epitaxial layer 130, plural constituent elements constituting the image sensor are formed.

A deep well 107 may be formed on a lower region of the epitaxial layer 130, and may be a P-type ion injection region. The deep well 107 may form an additional potential barrier so as to prevent electrons in the lower regions from flowing into the photoelectric conversion unit 210.

The isolation region 209 is formed within the epitaxial layer 130 to define an active region. Generally, the isolation region 209 may be FOX (Field Oxide) or STI (Shallow Trench Isolation) using a LOCOS (LOCal Oxidation of Silicon) method.

Also, adjacent the sides of the isolation region 209 and below the lower part of the isolation region 209, the second conduction type (e.g. P type) separation well 208 may be formed. The separation wells 208 may serve to separate a plurality of photodiodes 112 from one another. In this embodiment, the isolation region 209 may be contiguous with the photodiode 212. In order to reduce crosstalk in a horizontal direction between the photodiodes 212, the separation well 208 may be formed to have a depth larger than the depth of the photodiodes 212.

The photoelectric conversion unit 210 is formed in the epitaxial layer 130, and includes an N-type photodiode 212, a P$^+$-type pinning layer 214.

The photodiode 212 accumulates electrons generated to correspond to an incident light, and the pinning layer 214 serves to reduce the dark current by reducing EHP (Electron-Hole Pair) thermally generated in the epitaxial layer 130.

Also, since the photo diode 212 is formed spaced apart from the wafer 100 by a predetermined distance, the photo diode 212 may be used as a region to perform photoelectric conversion of the epitaxial layer 130 on the lower part of the photodiode 212. Accordingly, the color sensitivity for a long wavelength light (e.g. a red wavelength) having a large penetration depth in silicon can be improved.

Also, the maximum impurity density of the photodiode 212 may be $1\times10^{15}$ to $1\times10^{18}$ atoms/cm$^3$, and the impurity density of the pinning layer 214 may be $1\times10^{17}$ to $1\times10^{20}$ atoms/cm$^3$. However, since the doping density and the doping position may differ according to the fabricating process and design, they are not limited to those as described above.

The charge detection unit 220 receives the electric charge accumulated by the photoelectric conversion unit 210 through the charge transmission unit 230. The charge transmission unit 230 includes a p-type impurity region 232, a gate insulating layer 234, a gate electrode 236, and spacers 238.

The photodiode 212 may wholly overlap the pinning layer 214 and partially overlap the impurity region 232. The impurity region 232 may serve to prevent dark current that is generated regardless of the image sensed in the turn-off state of the charge transmission unit 230. The impurity region 232 is formed close to the surface of the epitaxial layer 130 to prevent the dark current, for example, with a depth less than 2000 Å.

The gate insulating layer 234 may be made of SiO$_2$, SiON, SiN, Al$_2$O$_3$, Si$_3$N$_4$, Ge$_x$O$_x$N$_z$, Ge$_x$Si$_y$O$_z$, or a high-k material. Here, the high-k material may be formed of HfO$_2$, ZrO$_2$, Al$_2$O$_3$, Ta$_2$O$_5$, hafnium silicate, zirconium silicate, or a combination thereof in an atomic deposition method. Also, the gate insulating layer 234 may be formed by laminating two or more materials selected from the above-described layer materials as a multilayer. The gate insulating layer 234 may be formed with a thickness of 5 to 100 Å.

The gate electrode 236 may be formed of a conductive polysilicon layer, a metal layer such as W, Pt, or Al, a metal nitride layer such as TiN, a metal silicide layer obtained from a refractory metal such as Co, Ni, Ti, Hf, or Pt, or a combination thereof. Also, the gate electrode 236 may be formed by, but is not limited thereto, laminating the conductive polysilicon layer and the metal silicide layer in order or laminating the conductive polysilicon layer and the metal layer in order.

The spacer 238 is formed on both side walls of the gate electrode 136, and may be made of a nitride layer SiN, an oxide, or a high-k material.

Figure 22:
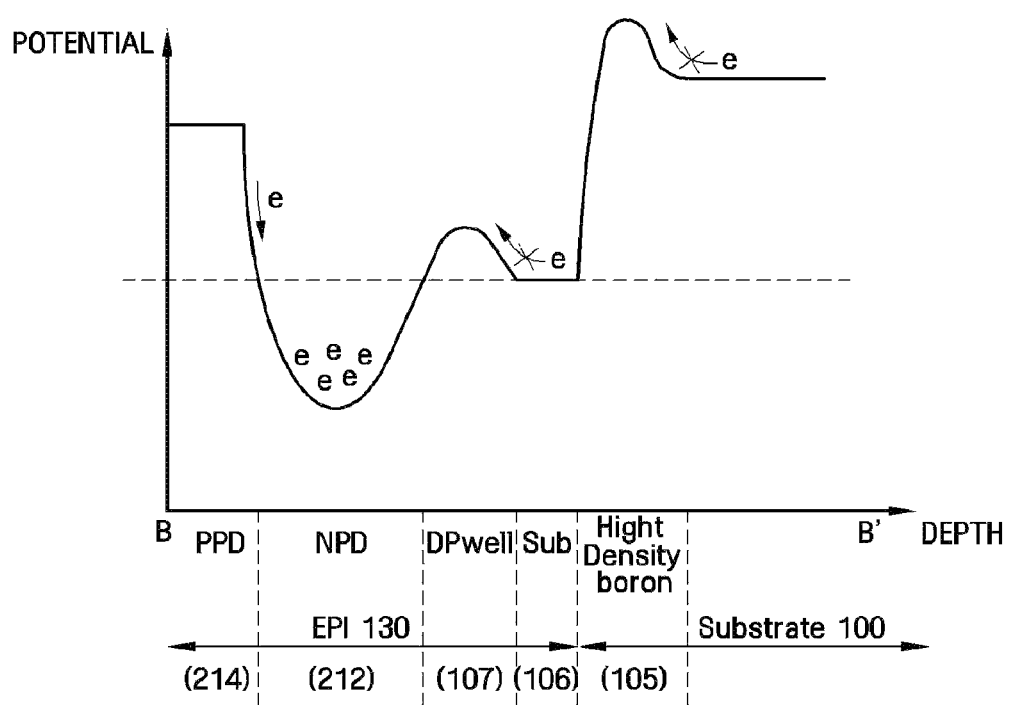
FIG. 22 is a view illustrating a chip implementing an image sensor according to embodiments of the present general inventive concept.

FIG. 22 illustrates a potential diagram taken along line B-B' of FIG. 21. Referring to FIGS. 21 and 22, the potential barrier of the deep well 107 and the high-density boron layer 105 is higher for electrons to overcome than that in other regions. That is, in the epitaxial layer 130, the deep well 107 forms a potential barrier, and in the wafer 100, the high-density boron layer 105 forms a potential barrier. Accordingly, electrons formed in a part of the substrate 106 or sub substrate 100 that is lower than the photoelectric conversion unit 210 cannot flow into the photoelectric conversion unit 210 to reduce the dark current.

Figure 23:
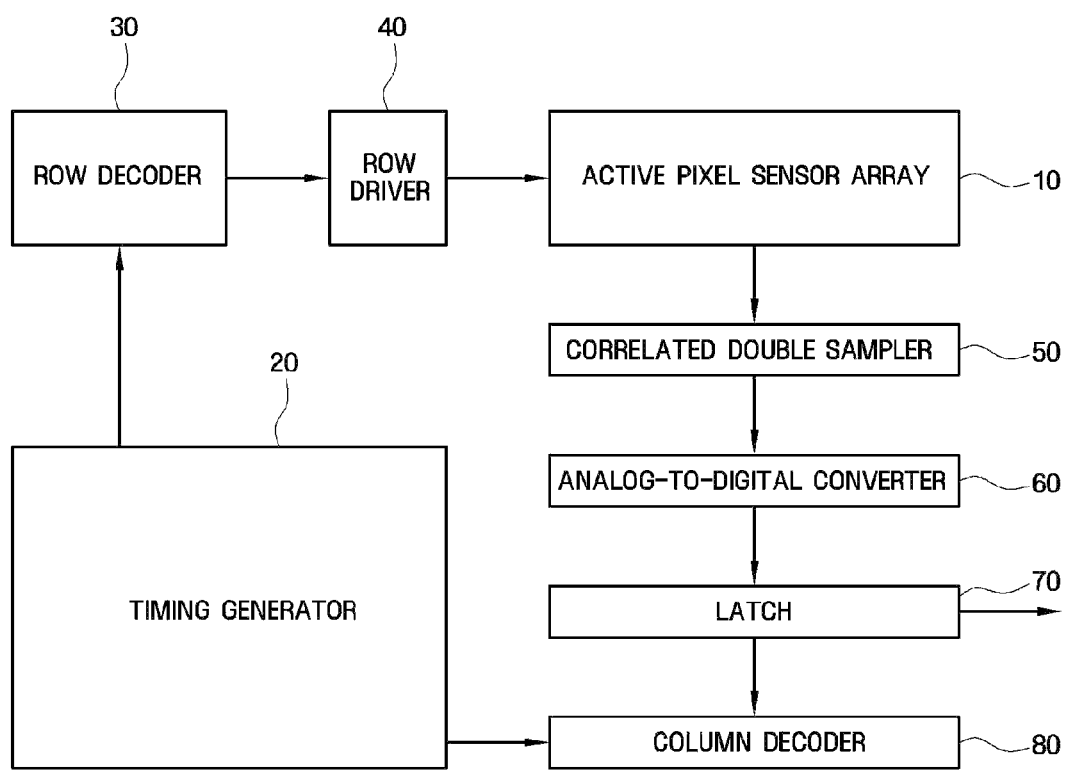
FIGS. 23 to 26 are views illustrating a processor based device including an image sensor according to embodiments of the present general inventive concept
Figure 24:
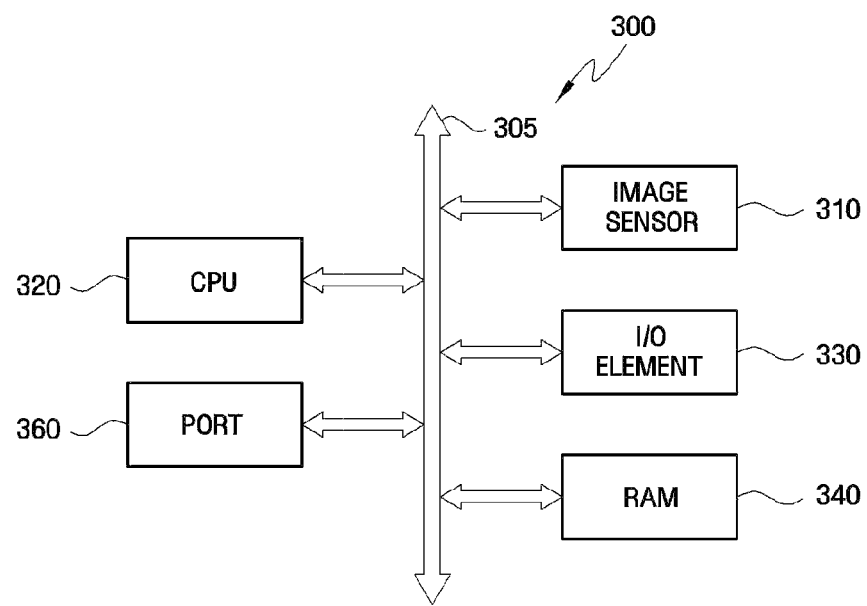
Figure 25A:
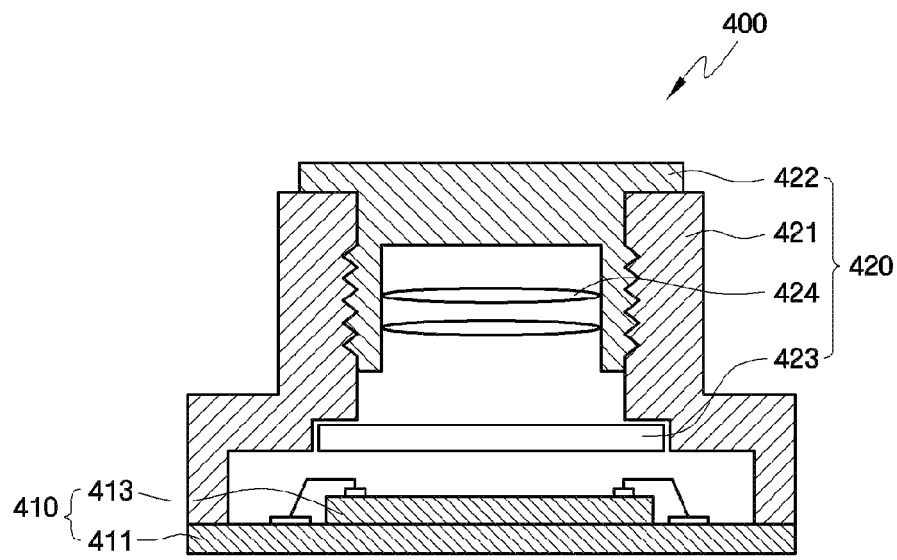
Figure 25B:
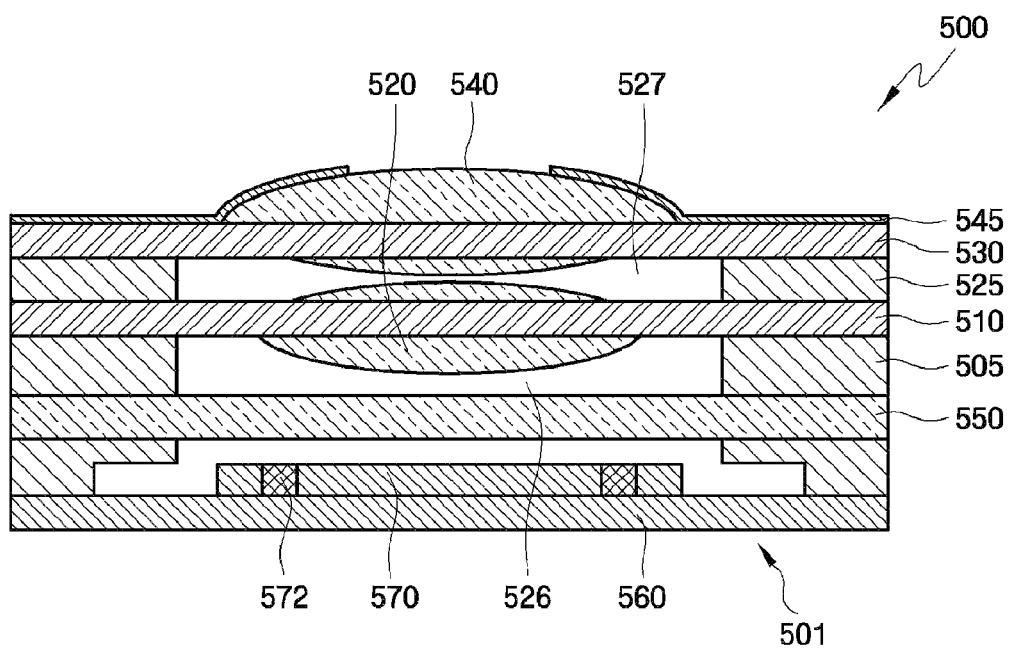
Figure 26:
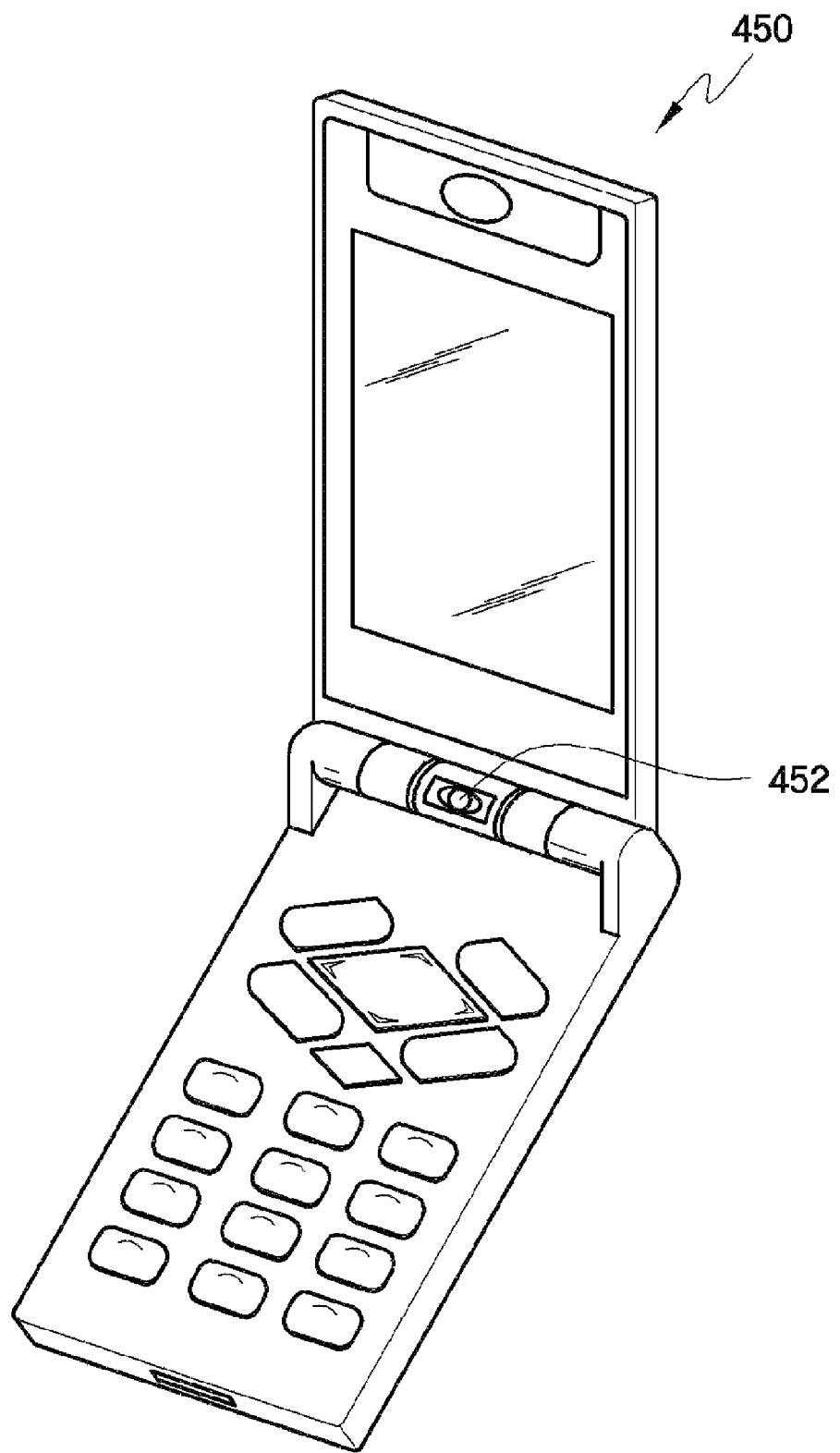

Hereinafter with reference to FIGS. 23 to 26, an apparatus using an image sensor according to embodiments of the present general inventive concept will be described. FIG. 23 is a view illustrating a chip implementing the image sensor according to embodiments of the present general inventive concept, and FIGS. 24 to 26 are views illustrating a processor-based apparatus including the image sensor according to embodiments of the present general inventive concept. FIG. 24 illustrates a computer device, FIGS. 25A and 25B illustrate a camera device, and FIG. 26 illustrates a portable phone device. It will be apparent that the image sensor according to the embodiments of the present general inventive concept can also be applied to other devices, for example, such as a scanner, a machined clock device, a navigation device, a video phone, a supervisory device, an auto focus device, a tracking device, an operation monitoring device, an image stabilizing device, and the like.

Referring to FIG. 23, the chip implementing the image sensor according to the embodiments of the present general inventive concept may include a sensor array 10 in which pixels including light sensing elements are arranged in two dimensions, a timing generator 20, a row decoder 30, a row driver 40, a correlated double sampler (CDS) 50, an analog-to-digital converter (ADC) 60, a latch 70, a column decoder 80, and the like.

The sensor array 10 may include a plurality of unit pixels two-dimensionally arranged. The unit pixels may serve to convert an optical image into an electric output signal. The sensor array 10 may be driven by receiving a plurality of drive signals, such as a row selection signal provided from the row driver 40, a reset signal, a charge transmission signal, and the like. Also, the converted electric output signal may be provided to the correlated double sampler 50 through vertical signal lines.

The timing generator 20 provides a timing signal and a control signal to the row decoder 30 and the column decoder 80.

The row driver 40 provides a plurality of drive signals to drive the unit pixels to the active pixel sensor array 10 in accordance with the results of decoding performed by the row decoder 30. Generally, in the case in which the unit pixels are arranged in a matrix form, the row driver provides a drive signal for each row.

The correlated double sampler 50 receives the output signals formed in the active pixel sensor array 10 through vertical signal lines, and performs holding and sampling of the received signals. That is, by doubly sampling specified noise levels and signal levels by the output signals, the correlated double sampler outputs a difference level to correspond to the difference between the noise level and the signal level.

The ADC 60 converts an analog signal to correspond to the difference level into a digital signal to output the digital signal.

The latch unit 70 latches the digital signal, and sequentially outputs the latched signal to an image signal processing unit (not illustrated) according to the results of decoding performed by the column decoder 80.

The functional blocks illustrated in FIG. 23 may be implemented into one chip or several chips. For example, the timing generator 20 may be configured as a separate chip, and the remaining components may be implemented into one chip. For example, the described chips may be implemented in the form of a package.

Referring to FIG. 24, a computer device 300 includes a central processing unit (CPU) 320 such as a microprocessor that can communicate with an input/output (I/O) device 330 through a bus 305. An image sensor 310 can communicate with a device through the bus 305 or other communication link. Also, the processor-based device 300 may further include a RAM 340 and/or port 360 which can communicate with the CPU 320 through the bus 305. The port 360 is a port which can couple a video card, a sound card, a memory card, a USB device, or the like, or which can perform data communication with another device. The image sensor 310 may be integrated together with the CPU, digital signal processor (DSP), or microprocessor. Also, a memory may be integrated together. Of course, if necessary, a chip that is separate from the processor may be integrated.

Referring to FIG. 25A, a camera device 400 may include an image sensor package 410 in which an image sensor 413 can be packaged through bonding wires 415 on the circuit board 411. Also, disposed on the circuit board 411 may be a housing 420 to attach to and protect the circuit board 411 and the image sensor 413 from external surroundings.

In the housing 420, an optical tube assembly 421 through which an image to be captured and passed is formed, and in an outer end part of the housing 420 which directs the outside of the optical tube assembly 421, a protection cover 422 may be installed. In the inner end part of the optical tube assembly, an infrared blocking and reflection prevention filter 423 may be mounted. Also, inside the optical tube assembly 421, a plurality of lenses 424 may be mounted to move along a screw thread part of the optical tube assembly 421.

Referring to FIG. 25B, a camera device 500 including an image sensor package 501 using a through via 572 is illustrated. Using the through via 572, an image sensor 570 and a circuit board 560 can be electrically connected together without using wire bonding. Here, the reference numeral 520 denotes a first lens, 540 denotes a second lens, and 526 and 527 denote lens components. Also, 505 and 525 denote support members, 545 denotes an aperture, 510 and 530 denote transparent substrates, and 550 denotes glass.

Referring to FIG. 26, an image sensor 452 is attached to a specified position of a mobile phone system 450. It will be apparent to those of ordinary skill in the art that the image sensor 452 may be attached to a part other than the part as illustrated in FIG. 26

Although example embodiments of the present general inventive concept have been described for illustrative purposes, those skilled in the art will appreciate that various modifications, additions and substitutions are possible, without departing from the scope and spirit of the general inventive concept as disclosed in the accompanying claims.

Although a few embodiments of the present general inventive concept have been illustrated and described, it would be appreciated by those skilled in the art that changes may be made in these embodiments without departing from the principles and spirit of the general inventive concept, the scope of which is defined in the claims and their equivalents.

What is claimed is:

1. A method of fabricating an epi-wafer comprising:
    providing a wafer including boron by cutting a single crystal silicon ingot;
    growing an insulating layer on one surface of the wafer;
    performing thermal treatment of the wafer;
    removing the insulating layer formed on one surface of the wafer;
    mirror-surface-grinding one surface of the wafer; and
    growing an epitaxial layer on one surface of the wafer and forming a high-density boron layer within the wafer to correspond to an interface between the wafer and the epitaxial layer.

2. The method of claim 1, wherein when the insulating layer is formed on one surface of the wafer, boron on one surface of the wafer is diffused into the wafer to form a high-density boron layer within the wafer.

3. The method of claim 1, wherein growing of the insulating layer on one surface of the wafer is performed simultaneously with forming a second insulating layer on the other surface of the wafer.

4. The method of claim 1, further comprising forming a second insulating layer on the other surface of the wafer.

5. The method of claim 1, wherein the insulating layer is an oxide layer, an oxynitride layer, or a nitride layer.

6. A method of fabricating an epi-wafer comprising:
    providing a wafer including high-density boron by cutting a single crystal silicon ingot;
    growing an oxide layer on one surface of the wafer by a low-temperature oxidation process;
    growing an oxide layer on the other surface of the wafer by a middle-temperature oxidation process to diffuse boron on the other surface of the wafer into the inside of the wafer;
    removing the oxide layer formed on the other surface of the wafer;
    mirror-surface-grinding the other surface of the wafer; and
    growing an epitaxial layer on the other surface of the wafer and forming a high-density boron layer within the wafer that corresponds to an interface between the wafer and the epitaxial layer.

7. The method of claim 6, further comprising performing thermal treatment of the wafer after the oxide layer is formed on the other surface of the wafer.

8. A method of fabricating an epi-wafer comprising:
    providing a wafer including boron by cutting a single crystal silicon ingot;

growing an oxide layer on one surface of the wafer;
removing the oxide layer formed on one surface of the wafer;
mirror-surface-grinding one surface of the wafer; and
growing an epitaxial layer on one surface of the wafer and forming a high-density boron layer within the wafer that corresponds to an interface between the wafer and the epitaxial layer.

9. A method of forming a semiconductor device, the method comprising:
forming a doped semiconductor ingot; cutting the semiconductor ingot into at least one doped sub substrate;
thermally oxidizing the doped sub substrate to form a highly doped layer in an upper surface of the sub substrate and a semiconductor oxide layer above the highly doped layer; removing the semiconductor oxide layer from the sub substrate; and growing an epitaxial layer above the sub substrate and forming a plurality of doped regions within the epitaxial layer.

10. The method of claim 9, further comprising:
forming a substrate above the sub substrate; and
forming a deep well region of a first conductivity type above the substrate and below the epitaxial layer.

11. The method of claim 9, wherein the thermal oxidizing forms a doped silicon region within the semiconductor oxide layer.

12. A method of forming a semiconductor device, the method comprising:
forming an ingot with a substantially uniform density of dopants of a first conductivity type;
dividing the ingot into at least one substrate;
growing a silicon oxide layer on the substrate; and
diffusing the dopants into the silicon oxide layer from the substrate,
wherein the density of the dopants in the substrate is increased at a junction between the substrate and silicon oxide layer and decreased in lower portions of the substrate.

* * * * *

UNITED STATES PATENT AND TRADEMARK OFFICE
CERTIFICATE OF CORRECTION

| | | |
|---|---|---|
| PATENT NO. | : 8,143,142 B2 | Page 1 of 1 |
| APPLICATION NO. | : 12/723882 | |
| DATED | : March 27, 2012 | |
| INVENTOR(S) | : Young-Soo Park et al. | |

It is certified that error appears in the above-identified patent and that said Letters Patent is hereby corrected as shown below:

On the title page, insert item (30):

--(30) Foreign Application Priority Data

March 13, 2009 (KR)....10-2009-0021760--

Signed and Sealed this
Twelfth Day of June, 2012

David J. Kappos
*Director of the United States Patent and Trademark Office*